United States Patent [19]

Sato

[11] Patent Number: 4,733,288
[45] Date of Patent: Mar. 22, 1988

[54] GATE-ARRAY CHIP

[75] Inventor: Shinji Sato, Yokohama, Japan

[73] Assignee: Fujitsu Limited, Kawasaki, Japan

[21] Appl. No.: 828,097

[22] Filed: Feb. 10, 1986

Related U.S. Application Data

[63] Continuation of Ser. No. 509,608, Jun. 30, 1983, abandoned.

[30] Foreign Application Priority Data

Jun. 30, 1982 [JP] Japan .................. 57-111529

[51] Int. Cl.$^4$ ............................................. H01L 27/02
[52] U.S. Cl. ...................................... 357/40; 357/45; 357/68
[58] Field of Search .............................. 357/40, 45, 68

[56] References Cited

U.S. PATENT DOCUMENTS 3,839,781 10/1974 Russell .
3,849,872 11/1974 Hubacher .................. 357/40

FOREIGN PATENT DOCUMENTS 0002683 1/1979 Japan ..................... 357/68
0079647 5/1982 Japan ..................... 357/45

OTHER PUBLICATIONS

IBM Technical Disclosure Bulletin, vol. 14, #9, Feb. 72, "Formation of Kerf... on Semiconductor Wafers", by Mandia et al.
IBM Tech. Disc. Bulletin, vol. 14, #12, May 72, by Tsui: "Masterslice Concept for Multiple Chip Sizes".
IBM Tech. Disc. Bulletin, vol. 22, #4, Sep. 79, by Ballista et al., "Logic Masterslice Design".
Electronic Engineering, vol. 54, No. 663, Mar. 1982, "Designing with ULA's; Part 1: Technology and Circuits Elements", pp. 53–57.
IEEE Journal of Solid-State Circuits, vol. SC-16, No. 5, Oct. 1981, "CMOS/SOS Automated Universal Array", by Borgini et al., pp. 563–570.

Primary Examiner—Andrew J. James
Assistant Examiner—Mark Prenty
Attorney, Agent, or Firm—Staas & Halsey

[57] ABSTRACT

A gate-array chip includes a plurality of basic-cell arrays arranged in parallel on a semiconductor bulk and a plurality of impurity regions formed on the semiconductor bulk and in regions between the basic-cell arrays. The impurity regions and part of the basic-cell arrays are adapted to form input/output circuits whereby the gate-array chip is divided into several chips each having a desired size and a desired number of gates.

10 Claims, 11 Drawing Figures

*Fig. 1*

PRIOR ART

GATE-ARRAY CHIP

This is a continuation of co-pending application Ser. No. 509,608 filed on June 30, 1983 and now abandoned.

BACKGROUND OF THE INVENTION

1. Field of the Invention

The present invention relates to a gate-array large-scale integration (LSI) chip and more particularly to a gate-array LSI chip of a semiconductor integrated circuit in which input/output circuits can be formed within the internal area thereof so that the gate-array LSI chip can be cut into a plurality of chips each having any desired size and any desired number of gates.

2. Description of the Prior Art

Due to improvement in the integration degree of semiconductor integrated circuits, there has been a need to realize a gate-array LSI chip having any desired size and any desired number of gates.

Generally, in the internal area of a gate-array LSI chip, a number of gate-cell arrays extending in parallel and having wiring regions therebetween are provided for constructing desired circuits such as inverters, NAND gates, NOR gates, and so forth. On the periphery of the chip, protective input circuits, input/output buffers, and so forth are arranged for forming input/output pads and input/output circuits.

A conventional gate-array LSI chip does not have, in the internal area thereof, any region for forming an input/output pad or an input/output circuit. Therefore, it is not possible to cut the chip into a plurality of chips. Accordingly, chips obtained from one bulk pattern are all of the same size and have the same number of gates. When the required number of gates on one chip for forming a desired circuit is smaller than the actual number of gates on the same chip, some of the gates on the chip are not used. These unused gates are wasted and make the chip size unnecessarily large.

SUMMARY OF THE INVENTION

An object of the present invention is to provide cutting regions in wiring regions within the internal region of a gate-array LSI chip.

Another object of the present invention is to form input/output circuits near the above-mentioned cutting regions.

Still another object of the present invention is to provide a gate-array LSI chip which can be cut into a plurality of chips, each of the chips having a desired size and a desired number of gates in accordance with a circuit design.

To attain the above objects, there is provided a gate-array chip comprising a semiconductor bulk, a plurality of basic-cell arrays arranged in parallel on the semiconductor bulk, each of the basic-cell arrays including a plurality of basic cells and a plurality of impurity regions formed on the semiconductor bulk and in regions between the basic-cell arrays, the impurity regions and part of the basic cells being adapted to form input/output circuits.

BRIEF DESCRIPTION OF THE DRAWINGS

The above object and other objects, as well as the characteristic features, of the invention will be more apparent and more readily understandable from the following description and the appended claims when read in conjunction with the accompanying drawings, wherein:

DESCRIPTION OF THE PREFERRED EMBODIMENTS

Before describing the embodiments of the present invention, a conventional gate-array LSI chip is described with reference to FIGS. 1 through 4.

Figure 1:
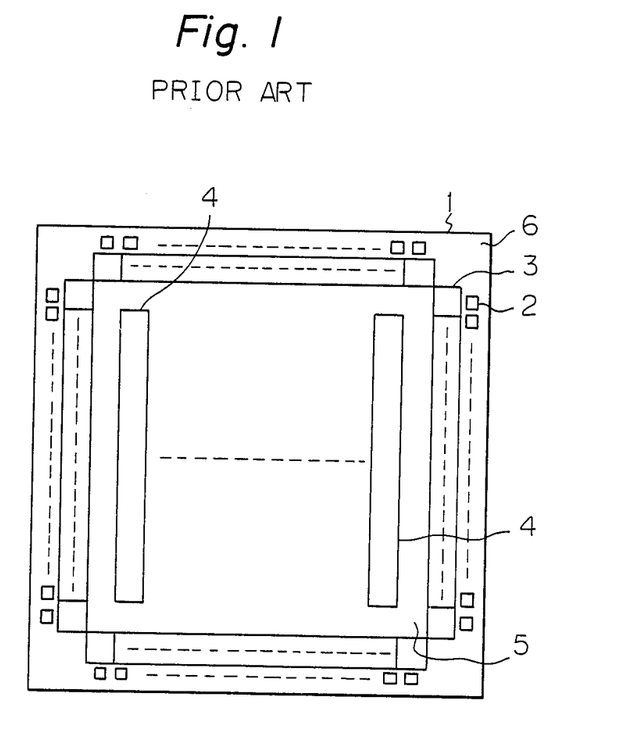
FIG. 1 is a general plan view of the physical pattern of a conventional gate-array LSI chip.

FIG. 1 is a general plan view of part of a conventional gate-array LSI chip. In the figure, on the periphery of a gate-array LSI chip 1, a number of input/output pads 2 are arranged. In the inside region of the input/output pads 2, input/output circuit regions 3 are formed so as to be adjacent to the input/output pads 2. In the inside region of the input/output circuit regions 3, a number of basic-cell arrays 4 are arranged. The basic-cell arrays 4 extend in one direction and are separated from each other by a predetermined space. The regions between each input/output circuit region 3 and the adjacent basic-cell array 4 and the regions between adjacent basic-cell arrays 4 are wiring regions 5. The input/output pads 2, the input/output circuit regions 3, the basic-cell arrays 4, and the wiring regions 5 are formed on a semiconductor bulk 6.

Figure 2:
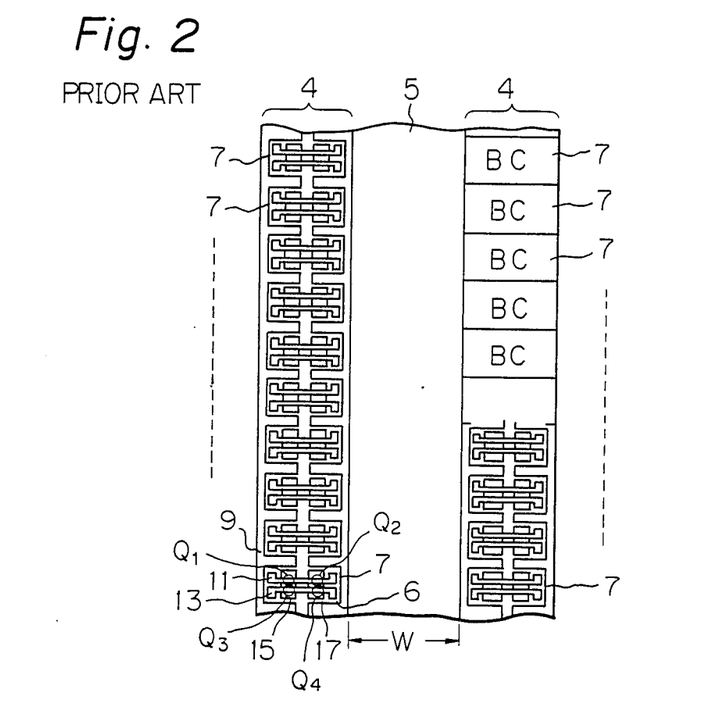
FIG. 2 is a detailed, expanded pattern view of a part of FIG. 1.

FIG. 2 is an expanded plan view of the two basic-cell arrays 4 arranged in the internal region of the chip 1 shown in FIG. 1 and one of the wiring regions 5 between these basic-cell arrays 4. As is shown in the figure, each of the basic-cell arrays 4 comprises a number of basic cells 7 having the same structure and being formed by a bulk pattern. The basic cells 7 in each basic-cell array are arranged to extend in one direction. The basic cells 7 included in each basic-cell array 4 are electrically isolated from each other by isolation regions 9. Each basic cell 7 comprises two gate electrodes 11 and 13 formed on the semiconductor bulk 6 through an insulating layer (not shown) and a P-type diffusion layer 15 and an N-type diffusion layer 17 formed near the surface of the semiconductor bulk 6 by utilizing the gate electrodes as masks. The gate electrode 11 and the P-type diffusion layer 15 form a P-channel metal-oxide semiconductor (MOS) transistor $Q_1$; the gate electrode 11 and the N-type diffusion layer 17 form an N-channel MOS transistor $Q_2$; the gate electrode 13 and the P-type diffusion layer 15 form a P-channel MOS transistor $Q_3$; and the gate electrode 13 and the N-type diffusion layer 17 form an N-channel MOS transistor $Q_4$. The P-channel MOS transistor $Q_1$ and the N-channel MOS transistor $Q_2$ commonly have the gate electrode 11, and the P-channel MOS transistor $Q_3$ and the N-channel MOS transistor $Q_4$ commonly have the gate electrode 13.

Figure 3:
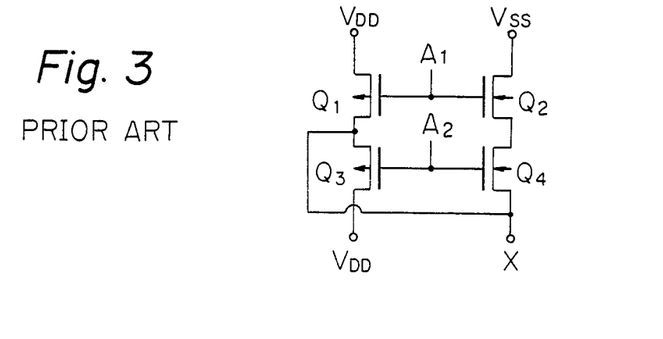
FIG. 3 is a circuit diagram of a two-input NAND gate realized by the pattern of FIG. 1.

FIG. 3 is a circuit diagram of a two-input NAND gate as an example realized by one of the basic cells 7. The circuit receives two inputs $A_1$ and $A_2$ at the gates of the transistors $Q_1$ and $Q_2$ and $Q_3$ and $Q_4$, respectively, and provides a NAND output X.

Figure 4:
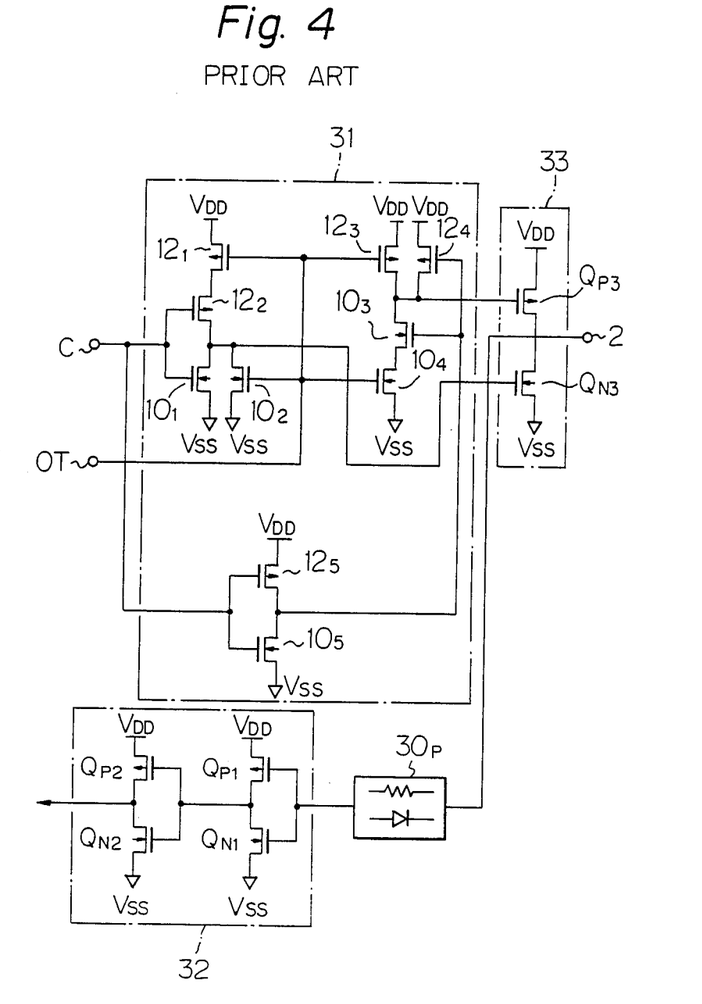
FIG. 4 is a circuit diagram of a bi-directional buffer circuit realized by the pattern of FIG. 1.

FIG. 4 is a circuit diagram of a bi-directional buffer circuit as an example of the input/output circuits formed in the input/output circuit regions 3. In FIG. 4, five N-channel MOS transistors $10_1$ through $10_5$ and five P-channel MOS transistors $12_1$ through $12_5$, forming a circuit 31, two P-channel MOS transistors $Q_{P1}$ and $Q_{P2}$ and two N-channel MOS transistors $Q_{N1}$ and $Q_{N2}$, forming an input buffer circuit 32, a P-channel MOS output transistor $Q_{P3}$ and an N-channel MOS output transistor $Q_{N3}$ forming an output buffer circuit 33 and a protective circuit $30_P$, are all used to form the bi-directional buffer circuit.

The operation of the bi-directional buffer circuit of FIG. 4 is well known. Briefly, when a control signal applied to a control terminal C is at a high level (H), both of the output transistors $Q_{P3}$ and $Q_{N3}$ are turned off so that the input/output pad 2 assumes a high impedance state. In this state, no output data applied from the internal circuits to an output data terminal OT can be obtained at the input/output pad 2. Instead, input data applied to the input/output pad 2 can be supplied through the protective circuit $30_P$ and the input buffer circuit 32 to the internal circuits. In contrast, when the control signal applied to the control terminal C is at a low level (L), the output data from the internal circuits can be transferred through the circuit 31 and through the output buffer circuit 33 to the input/output pad 2.

Referring back to FIG. 2, each of the wiring regions 5 is generally referred to as a field portion of a thick oxidation film not having a bulk pattern. The widths W of all of the wiring regions 5 are the same. In such narrow regions as the wiring regions 5, it is impossible, in the present technique, to form input/output pads. Therefore, conventionally, it is impossible to form input/output pads or input/output circuit regions in the internal area of a conventional chip. Accordingly, a conventional chip cannot be cut into several chips each having a desired size or a desired number of gates.

Figure 5:
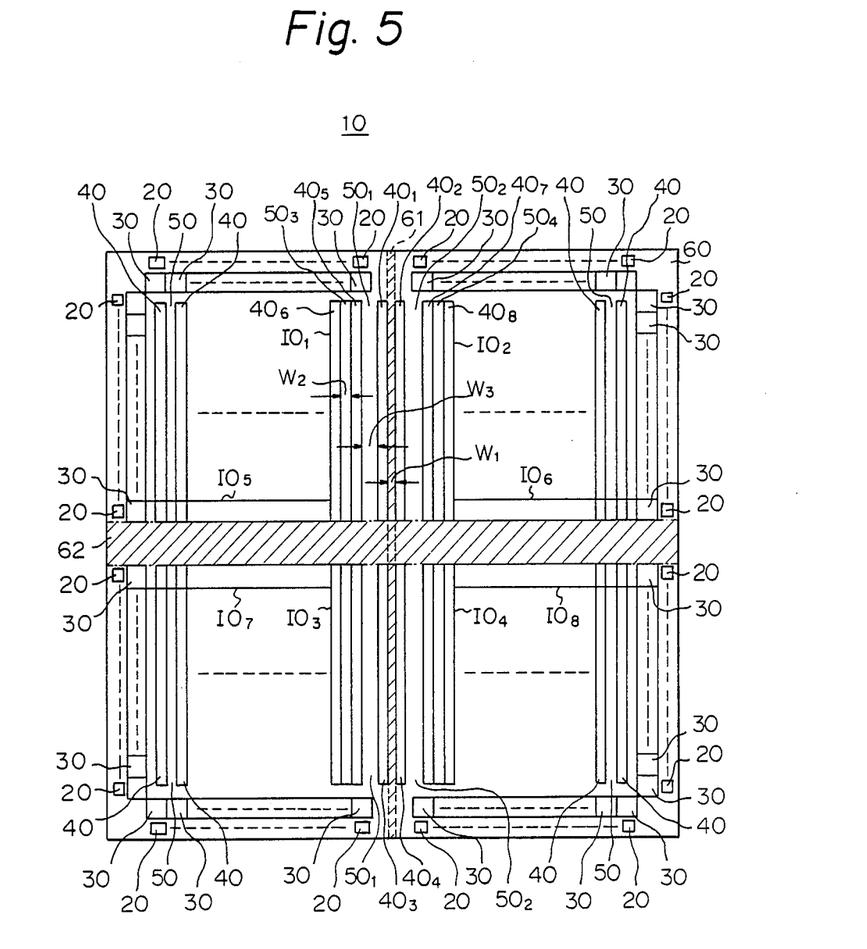
FIG. 5 is a general plan view of the physical pattern of a gate-array LSI chip according to an embodiment of the present invention.

An embodiment of the present invention is now described with reference to FIGS. 5 through 9. FIG. 5 is a general plan view of the physical pattern of a gate-array LSI chip according to an embodiment of the present invention. In the figure, a gate-array LSI chip 10 has a semiconductor bulk 60. On the periphery of the semiconductor bulk 60, a number of peripheral input/output pads 20 are arranged in a conventional manner. On the inside portion of the peripheral input/output pads 20, peripheral input/output circuit regions 30 are formed in a conventional manner so as to be adjacent to the peripheral input/output pads 20. The input/output pads 20 and the input/output circuit regions 30 on each side of the chip 10 are separated by cutting regions 61 and 62, which are provided according to the present invention and which are illustrated by slashed lines. In this embodiment, the chip 10 can be cut into four small chips by the cutting regions 61 and 62. On the inside portions of the peripheral input/output circuit regions 30, a plurality of basic-cell arrays 40 are arranged so as to extend in a longitudinal direction. Between the basic-cell arrays 40 is a wiring region 50. Each of the basic-cell arrays 40 is divided into an upper array and a lower array by the cutting region 62, which extends into the middle portion of the chip 10 in a transverse direction. The wiring regions, between the adjacent basic-cell arrays $40_1$ and $40_2$, extending into the middle portion of the upper portion of the chip 10, and between the adjacent basic-cell arrays $40_3$ and $40_4$, extending into the middle portion of the lower portion of the chip 10, are used as the longitudinally extending cutting region 61. The wiring region $50_1$, adjacent to the basic-cell arrays $40_1$ and $40_3$ and positioned opposite to the cutting region 61, is a region for forming input/output pads. Similarly, the wiring region $50_2$, adjacent to the basic-cell arrays $40_2$ and $40_4$, is a region for forming input/ouput pads. Input/output circuits $IO_1$ can be formed by the two basic-cell arrays $40_5$ and $40_6$ and the wiring region $50_3$. The adjacent basic-cell arrays $40_5$ and $40_6$ are adjacent to the wiring region $50_3$. Similarly, input/output circuits $IO_2$ can be formed by the two basic-cell arrays $40_7$ and $40_8$, adjacent to the wiring region $50_2$, and the wiring region $50_4$ between the basic-cell arrays $40_7$ and $40_8$. Further, in the lower portion of the chip 10, input/output circuits $IO_3$ and $IO_4$ can be formed so as to be adjacent to the wiring regions $50_1$ and $50_2$, respectively.

In this embodiment, the width $W_1$ of the cutting region 61 is made smaller than the width $W_2$ of other wiring regions 50, and the width $W_3$ of the region $50_1$ or $50_2$, for forming input/output pads, is made larger than the width $W_2$ of other wiring regions 50 so that input/output pads can be formed in the regions $50_1$ and $50_2$.

Also, input/output pads can be formed on the upper and lower portions of the cutting region 62 which extends in a transverse direction. Input/output circuits $IO_5$, $IO_6$, $IO_7$, and $IO_8$ can also be formed by a number of basic cells and part of the area of the wiring regions 50, near the cutting region 62. By cutting the chip along the cutting regions 61 and 62, the gate-array LSI chip 10 can be divided into four chips. The cutting regions and the regions near the cutting regions in which input/output pads and input/output circuits can be formed are explained in detail.

Figure 6A:
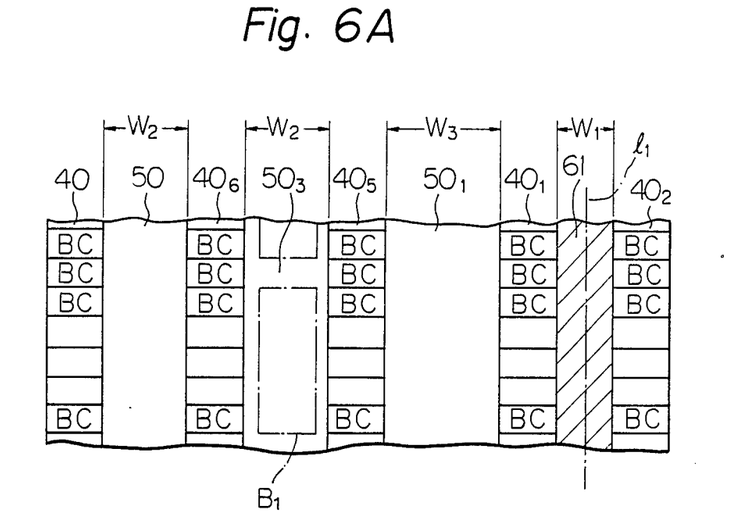
FIG. 6A is an expanded plan view of a part of the chip of FIG. 5 before the cutting thereof along a longitudinal line.

FIG. 6A is an expanded plan view of a part of the chip of FIG. 5 before the cutting thereof along a longitudinal line. In the figure, each basic-cell array 40, $40_1$, $40_2$, $40_5$, or $40_6$ comprises a number of basic cells BC having the same structure and being arranged in one direction in a conventional manner. The size of each basic cell BC is the same as that of a conventional basic cell. The width $W_2$ of each wiring region, except for the cutting region 61 and the input/output pad-forming region $50_1$, is the same as the conventional width. In contrast, the width $W_1$ of the cutting region 61 is narrower than the width $W_2$ of other wiring regions, and the width $W_3$ of the input/output pad-forming region $50_1$ is wider than the width $W_2$ of other wiring regions. By making the width of the input/output pad-forming region $50_1$ wider than the width of other wiring regions, input/output pads can be formed on the input/output pad-forming region $50_1$.

To form an input/output circuit, it is necessary to at least use a protective circuit, an input buffer circuit, an output buffer circuit, or a three-state output circuit, depending on the type of input/output circuit. The gate width of a transistor in an output buffer circuit or in a three-state output circuit is several times wider than the gate width of a transistor in the basic cell BC. Therefore, an output buffer circuit and a three-state output circuit can be formed by the basic cells BC in the basic-cell arrays $40_5$ and $40_6$. The gate width of a transistor in an input buffer circuit, however, is narrower than the gate width of a transistor in the basic-cell arrays, with the result that an input buffer circuit cannot be formed by the basic cells BC. To make it possible to form an input buffer circuit and a protective circuit, a bulk pattern $B_1$ comprising an impurity diffusion region is formed under the surface of the wiring region $50_3$ between the basic-cell arrays $40_5$ and $40_6$. An insulating film (not shown) covers the bulk pattern $B_1$. The input/output circuit region, in which the bulk pattern $B_1$ is formed, is adapted to be a source region or a drain region of a metal-insulator semiconductor transistor or a base or an emitter of a bipolar transistor in an input buffer circuit or a diffusion region of a protective diode in a protective circuit. When the chip 10 is not cut along a cutting line $l_1$ in the cutting region 61, a contact window (not shown) in the insulating film on the bulk pattern $B_1$ is not opened so that the wiring region $50_3$ is not used as the input/output circuit region but is used as the wiring region in a manner similar to the manner in which other wiring regions are used.

Figure 6B:
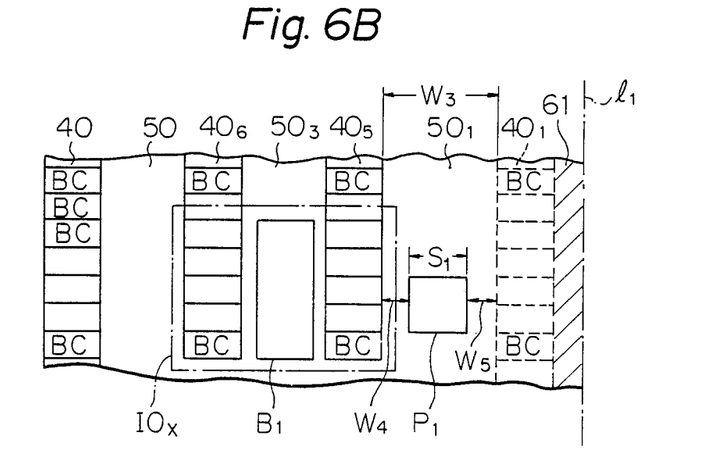
FIG. 6B is a part of FIG. 6A after the cutting of the chip along a longitudinal line.

FIG. 6B shows a part of FIG. 6A after the cutting of the chip 10 along the cutting line $l_1$. After the cutting of the chip 10 along the cutting line $l_1$, the basic-cell array $40_1$ (shown by the broken lines) adjacent to the cutting region 61 is not used. In the wiring region $50_1$ adjacent to the basic-cell array $40_1$, an input/output pad $P_1$ is formed. The input/output pad $P_1$ can be formed in the wiring region $50_1$ as long as the width $W_3$ of the wiring region $50_1$ is made greater than the size $S_1$ of one side of the input/output pad $P_1$ plus the widths $W_4$ and $W_5$ of the inhibiting region for forming valid patterns. An input/output circuit $IO_X$ is formed by at least one of the basic cells BC in the basic-cell arrays $40_5$ and $40_6$ and the bulk pattern $B_1$ for forming an input buffer circuit and a protective circuit, the bulk pattern $B_1$ being formed between the basic-cell arrays $40_5$ and $40_6$. In this case, the contact windows are selectively opened.

Figure 7A:
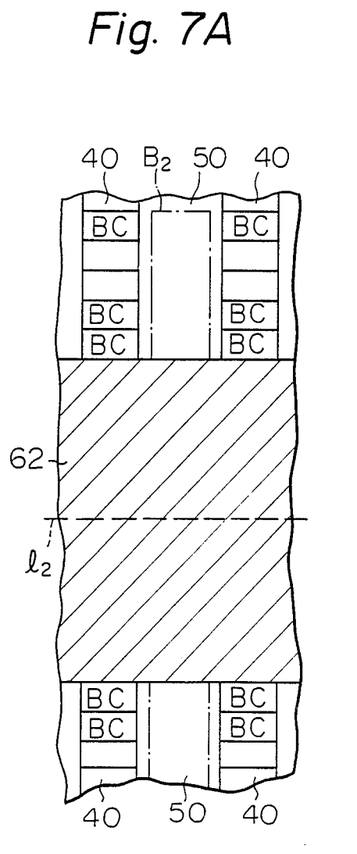
FIG. 7A is an expanded plan view of a part of FIG. 5 before the cutting of the chip along a transverse line.

FIG. 7A is an expanded plan view of a part of the chip of FIG. 5 before the cutting thereof along a transverse line. In the figure, the cutting region 62 has a width wide enough to form an input/output pad $P_2$ (FIG. 7B) therein after the chip is cut along a transverse cutting line $l_2$. Near the cutting region 62, and under the surface of each wiring region 50 between adjacent basic-cell arrays 40, a bulk pattern $B_2$ of an impurity diffusion region is formed so as to form input buffer circuits and protective circuits in a manner similar to the formation of the bulk pattern $B_1$.

Figure 7B:
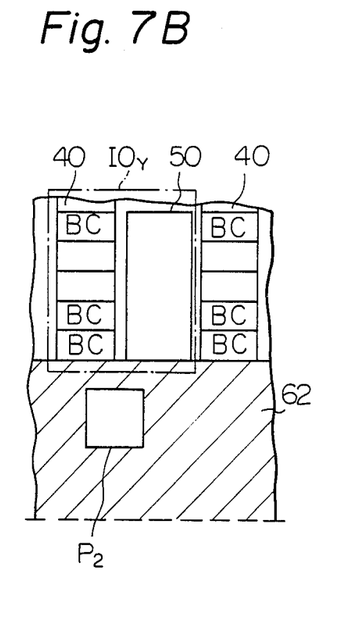
FIG. 7B is a part of FIG. 7A after the cutting of the chip along a transverse line.

FIG. 7B shows a part of FIG. 7A after the cutting of the chip 10 along the transverse cutting line $l_2$. In the figure, the input/output pad $P_2$ is formed in the cutting region 62. An input/output circuit $IO_Y$ is formed by connecting necessary basic cells BC in the basic-cell arrays 40 near the input/output pad $P_2$ and the bulk pattern $B_2$ adjacent to these arrays.

The equivalent circuit of the input/output circuit $IO_X$ or $IO_Y$ is well known and is illustrated in FIG. 4 as an example.

Figure 8:
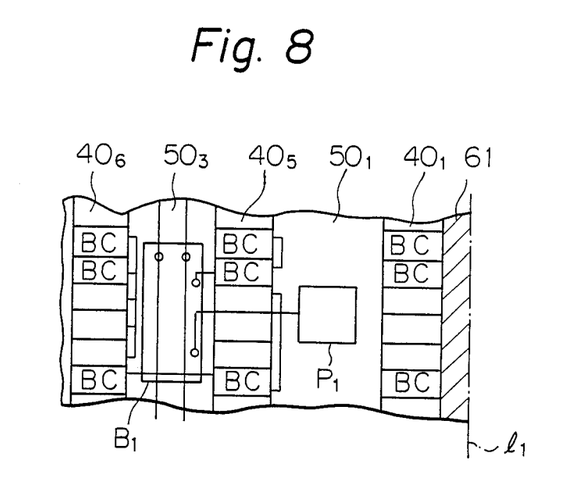
FIG. 8 is a part of FIG. 6B in which the wiring, after the cutting of the chip, is illustrated.

FIG. 8 shows a part of FIG. 6B in which the wiring after the cutting of the chip is illustrated. In the figure, when the chip 10 is cut along the longitudinal cutting line $l_1$, wiring is not carried out for the basic-cell array $40_1$ adjacent to the cutting region 61, and the window on the bulk pattern $B_1$ is opened so as to form an input/output circuit.

Figure 9:
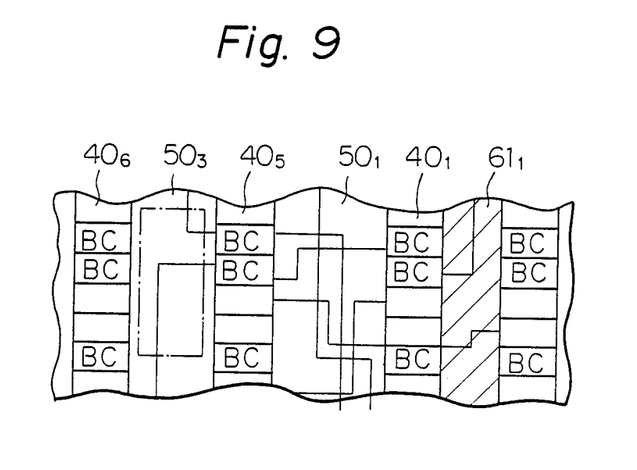
FIG. 9 is a part of FIG. 6A in which the wiring, when the chip is not cut, is illustrated.

FIG. 9 shows a part of FIG. 6A in which the wiring, when the chip 10 is not cut, is illustrated. In the figure, the cutting region 61 is used as a wiring region, and the window on the bulk pattern $B_1$ is not opened so that the region $50_3$ is also used as a wiring region.

In the foregoing embodiment, the gate-array LSI chip is cut into four identical chips. The present invention, however, is not restricted to the described embodiment. The longitudinal cutting region and the transverse cutting region may alternatively be provided in any desired position on the chip. Also, two or more cutting regions may be provided in one direction. Further, when the input/output pad is made smaller than the present input/output pad, the widths of the input/output pad-forming region and the transverse cutting region need not be as wide as previously described.

From the foregoing description, it will be apparent that, according to the present invention, by providing cutting regions in wiring regions within the internal region of a gate-array LSI chip and by forming input/output circuits near the cutting regions, one gate-array LSI chip can be divided into a plurality of chips. Thus, a gate-array LSI chip having a desired number of gates and a desired size in accordance with the design can be obtained.

I claim:

1. A gate-array chip comprising:
    a semiconductor bulk;
    a plurality of groups of basic-cell arrays arranged in parallel on said semiconductor bulk of said gate-array chip, each of said groups of basic-cell arrays including a plurality of basic-cells;
    a plurality of impurity regions provided for each of said groups of basic-cell arrays, formed on said semiconductor bulk and in regions between each of said groups of basic-cell arrays, first predetermined ones of said impurity regions and first predetermined ones of said groups of basic-cell arrays located on either side of said predetermined ones of said impurity regions connected to form input/output circuits;
    a first cutting region, formed between second predetermined ones of said basic-cell arrays, for enabling said plurality of groups of basic-cell arrays on said gate-array chip to be cut into smaller plurality of groups of basic cell arrays to form chips smaller than said gate-array chip; and
    first input/output pad forming regions formed adjacent to said first cutting region.

2. A gate-array chip as set forth in claim 1, further comprising:
    an insulating film formed on each of said plurality of impurity regions; and
    a contact window selectively formed in said insulating film, each of said impurity regions being electrically connected, through said contact window, to at least one of said basic cells.

3. A gate-array chip as set forth in claim 2, further comprising an input/output circuit formed by a connection of one of said plurality of impurity regions and said at least one of said basic cells, said impurity region being electrically connected through said contact window to said at least one of said basic cells.

4. A gate-array chip as set forth in claim 3, further comprising a plurality of wiring regions, each of said plurality of wiring regions being provided between said basic-cell arrays, at least one of said wiring regions forming the first cutting region for cutting said gate-array chip into a plurality of chips.

5. A gate-array chip as set forth in claim 4, further comprising at least one second cutting region, formed on said plurality of basic cell arrays and extending in a direction orthogonal to the direction of said basic-cell arrays, for dividing said gate-array chip into a plurality of chips.

6. A gate-array chip as set forth in claim 5, further comprising a second input/output pad-forming region formed in said at least one second cutting region.

7. A gate-array chip as set forth in claim 6, wherein said input/output circuit is formed adjacent to one of said first input/output pad-forming region and said second input/output pad-forming region.

8. A gate array chip formed on a semiconductor bulk, comprising:
   groups of basic-cell arrays, arranged in parallel on the semiconductor bulk, each of said groups of basic-cell arrays including basic-cells;
   a first cutting region, formed on the semiconductor bulk and adjacent each of said groups of basic cell arrays, for cutting said groups of basic-cell arrays on said gate array chip in a first direction into a plurality of groups of basic-cell arrays which are smaller than said groups of basic-cell arrays, to form chips smaller than said gate array chips ;
   wiring regions, formed on the semiconductor bulk and provided between adjacent ones of said groups of basic-cell arrays, at least a first one of said wiring regions formed adjacent said first cutting region for forming input/output pads, and at least a second of one of said wiring regions formed adjacent said first one of said wiring regions and formed between at least two of said groups of basic-cell arrays, said second one of said wiring regions and said at least two of said groups of basic-cell arrays being connected to form input/output circuits;
   a second cutting region formed on the semiconductor bulk and extending in a second direction orthogonal to said first cutting region for cutting said plurality of groups of basic-cell arrays in the second direction into smaller groups of basic-cell arrays to form chips smaller than said gate array chip; and
   impurity diffusion regions, formed under said wiring regions and between each of said groups of basic-cell arrays, said impurity diffusion regions and selected ones of said groups of basic-cells connected to form buffer circuits.

9. A gate array chip as set forth in claim 8, wherein said at least one of said wiring regions for forming said first cutting region is smaller in width than the remaining wiring regions.

10. A gate array chip as set forth in claim 9, wherein when said gate-array chip is cut into a plurality of chips, contact windows are selectively opened on said at least one of said wiring regions to form the input/output circuits.

* * * * *